United States Patent
Chang et al.

(10) Patent No.: US 12,261,084 B2
(45) Date of Patent: Mar. 25, 2025

(54) FAN-OUT WAFER LEVEL PACKAGING OF SEMICONDUCTOR DEVICES

(71) Applicant: SEMICONDUCTOR COMPONENTS INDUSTRIES, LLC, Phoenix, AZ (US)

(72) Inventors: George Chang, Tempe, AZ (US); Yusheng Lin, Phoenix, AZ (US); Gordon M. Grivna, Mesa, AZ (US); Takashi Noma, Ota (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 537 days.

(21) Appl. No.: 17/304,136

(22) Filed: Jun. 15, 2021

(65) Prior Publication Data

US 2021/0305096 A1 Sep. 30, 2021

Related U.S. Application Data

(62) Division of application No. 16/145,783, filed on Sep. 28, 2018, now Pat. No. 11,043,420.

(51) Int. Cl.
*H01L 23/31* (2006.01)
*H01L 21/683* (2006.01)
(Continued)

(52) U.S. Cl.
CPC .......... *H01L 21/78* (2013.01); *H01L 21/6836* (2013.01); *H01L 23/3107* (2013.01);
(Continued)

(58) Field of Classification Search
CPC ......... H01L 24/19–20; H01L 2224/19–22505; H01L 23/498–49894; H01L 23/538–5389
See application file for complete search history.

(56) References Cited

U.S. PATENT DOCUMENTS 6,107,685 A * 8/2000 Nishiyama ............. H01L 24/16
257/737
2007/0190688 A1 8/2007 Youn et al.
(Continued)

FOREIGN PATENT DOCUMENTS

CN 103383923 A 11/2013
CN 207338360 U 5/2018

OTHER PUBLICATIONS

Tom Strothmann, "Optimizing Equipment Selection for Diverse Fan-Out Process Flows," Semicon Taiwan 2016, Sep. 7-9, 2016.
(Continued)

*Primary Examiner* — Kevin Parendo
(74) *Attorney, Agent, or Firm* — Brake Hughes Bellermann LLP

(57) ABSTRACT

In a general aspect, a fan-out wafer level package (FOWLP) can include a semiconductor die having an active surface, a backside surface, a plurality of side surfaces, each side surface of the plurality of side surfaces extending between the active surface and the backside surface, a plurality of conductive bumps disposed on the active surface, and an insulating layer disposed on a first portion of the active surface between the conductive bumps. The FOWLP can also include a molding compound encapsulating the backside surface, the plurality of side surfaces, and a second portion of the active surface between the conductive bumps and a perimeter edge of the active surface. The FOWLP can also include a signal distribution structure disposed on the conductive bumps, the insulating layer and the molding compound. The signal distribution structure can be configured to provide respective electrical connections to the plurality of conductive bumps.

20 Claims, 12 Drawing Sheets

(51) Int. Cl.

| | |
|---|---|
| *H01L 21/78* | (2006.01) |
| *H01L 23/00* | (2006.01) |
| *H01L 23/498* | (2006.01) |
| *H01L 21/304* | (2006.01) |
| *H01L 21/56* | (2006.01) |

(52) U.S. Cl.
CPC .... *H01L 23/3121* (2013.01); *H01L 23/49816* (2013.01); *H01L 23/49838* (2013.01); *H01L 24/94* (2013.01); *H01L 24/95* (2013.01); *H01L 24/96* (2013.01); *H01L 21/304* (2013.01); *H01L 21/563* (2013.01); *H01L 2224/94* (2013.01); *H01L 2224/951* (2013.01); *H01L 2224/96* (2013.01)

(56) References Cited

U.S. PATENT DOCUMENTS

| | | |
|---|---|---|
| 2012/0168943 A1 | 7/2012 | Gan et al. |
| 2013/0005088 A1* | 1/2013 | Han .................. H01L 24/81 257/E21.599 |
| 2013/0095612 A1 | 4/2013 | Huang et al. |
| 2013/0341774 A1* | 12/2013 | Chang .................. H01L 21/568 438/123 |
| 2014/0210054 A1 | 7/2014 | Kosub et al. |
| 2015/0069634 A1* | 3/2015 | Oyama .................. H01L 23/562 257/777 |
| 2016/0035653 A1* | 2/2016 | Niu .................. H01L 24/03 257/368 |
| 2017/0221820 A1 | 8/2017 | Yu et al. |
| 2017/0250147 A1* | 8/2017 | Yu .................. H01L 24/13 |
| 2018/0254259 A1 | 9/2018 | Grivna |
| 2019/0096821 A1* | 3/2019 | Chiang .................. H01L 21/561 |
| 2019/0157209 A1* | 5/2019 | Wang .................. H01L 23/5386 |
| 2019/0164862 A1* | 5/2019 | Kim .................. H01L 23/3142 |
| 2019/0172781 A1* | 6/2019 | Lee .................. H01L 23/5389 |
| 2019/0378803 A1* | 12/2019 | Chang Chien .......... H01L 21/56 |
| 2020/0091103 A1 | 3/2020 | Chang Chien et al. |
| 2020/0126929 A1* | 4/2020 | Jeong .................. H01L 23/49811 |

OTHER PUBLICATIONS

T. Braun et al., "Opportunities and Challenges for Fan-out Panel Level Pckaging (FOPLOP)," SiP Global Summit 2015, Semicon Taiwan 2015, Sep. 2-4, 2015.
Ron Huemoeller et al., "Five Industry-Leading Packaging Technologies, IC packages for implementing next-generation devices to support the connected world of the future," Amkor Technology, Winter 2016.
John Hunt, "ASE Fan out Technologies," ASE Group, Feb. 14, 2018.
B. Rogers et al., "Implementation of a Fully Molded Fan-Out Packaging Technology," Deca technologies, Inc., Nov. 7, 2013.
First Office Action for Chinese Application No. 201910849864.3, mailed Sep. 29, 2024, (and full English translation), 26 pages.
U.S. Appl. No. 16/145,783, filed Sep. 28, 2018, Allowed.

* cited by examiner

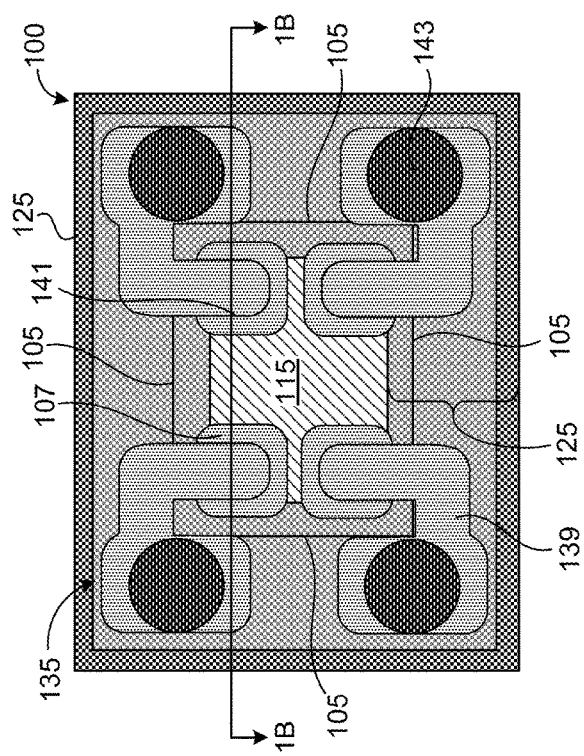
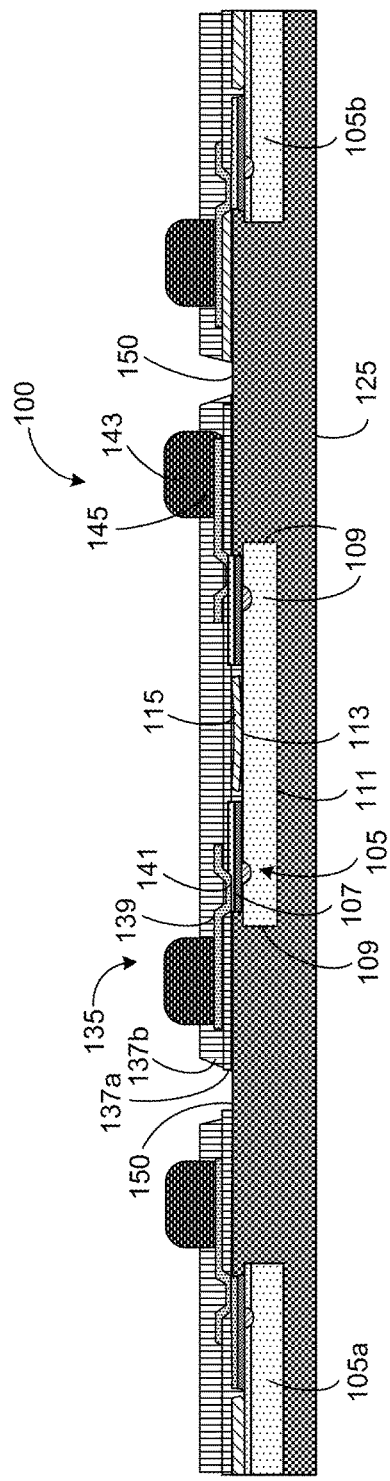
FIG. 1A
FIG. 1B

FAN-OUT WAFER LEVEL PACKAGING OF SEMICONDUCTOR DEVICES

RELATED APPLICATIONS

This application is a divisional application of U.S. patent application Ser. No. 16/145,783, filed Sep. 28, 2018, which is incorporated by reference herein in its entirety.

TECHNICAL FIELD

This description relates to packaged semiconductor devices and/or semiconductor device modules (packaged devices). More specifically, this description relates to semiconductor devices packaged in fan-out wafer level packages.

BACKGROUND

Semiconductor devices (e.g., semiconductor die) can be implemented in a number of different packing configurations. For example, a semiconductor die, such as a power transistor, power diode, etc., can be included in a wafer level package, such as fan-out wafer level package (FOWLP). However, current approaches for producing such FOWLPs packages can be cost prohibitive and/or can be susceptible to reliability issues, such as cracking of the semiconductor die included in a FOWLP.

SUMMARY

In a general aspect, a fan-out wafer level package (FOWLP) semiconductor device can include a semiconductor die having an active surface; a backside surface, opposite the active surface; a plurality of side surfaces, each side surface of the plurality of side surfaces extending between the active surface and the backside surface; a plurality of conductive bumps disposed on the active surface; and an insulating layer disposed on a first portion of the active surface. The first portion of the active surface can be disposed between the plurality of conductive bumps. The FOWLP can also include a molding compound encapsulating the backside surface, the plurality of side surfaces, and a second portion of the active surface. The second portion of the active surface can be disposed between the conductive bumps and a perimeter edge of the active surface. The FOWLP can further include a signal distribution structure disposed on the conductive bumps, disposed on the insulating layer and disposed on the molding compound. The signal distribution structure can be configured to provide respective electrical connections to the plurality of conductive bumps.

In another general aspect, a method of producing a fan-out wafer level package (FOWLP) semiconductor device can include cutting a semiconductor wafer into a plurality of semiconductor die. A semiconductor die of the plurality of semiconductor die can include an active surface; a backside surface, opposite the active surface; a plurality of side surfaces, each side surface of the plurality of side surfaces extending between the active surface and the backside surface; a plurality of conductive bumps disposed on the active surface; and an insulating layer disposed on a first portion of the active surface. The first portion of the active surface can be disposed between the plurality of conductive bumps. The method can also include increasing spacing between the plurality of semiconductor die, and encapsulating, in a molding compound, the backside surface, the plurality of side surfaces, and a second portion of the active surface of the semiconductor die. The second portion of the active surface can be disposed between the conductive bumps and a perimeter edge of the active surface. The molding compound can also be disposed between the plurality of semiconductor die. The method can further include forming a signal distribution structure. The signal distribution structure can be disposed on the conductive bumps, the insulating layer and the molding compound. The signal distribution structure can be configured to provide respective electrical connections to the plurality of conductive bumps.

In another general aspect, a method of producing a fan-out wafer level package (FOWLP) semiconductor device can include disposing a semiconductor wafer on a first carrier tape and cutting the semiconductor wafer into a plurality of semiconductor die. A semiconductor die of the plurality of semiconductor die can include: an active surface; a backside surface, opposite the active surface; a plurality of side surfaces each extending between the active surface and the backside surface; a plurality of conductive bumps disposed on the active surface; and an insulating layer disposed on a first portion of the active surface. The first portion of the active surface can be disposed between the plurality of conductive bumps. The method can further include increasing spacing between the plurality of semiconductor die by stretching the first carrier tape along a first axis of the first carrier tape, and along a second axis of the first carrier tape. The method can also include, after stretching the first carrier tape, transferring the plurality of semiconductor die from the first carrier tape to a second carrier tape, and stretching the second carrier tape along a first axis of the second carrier tape and along a second axis of the second carrier tape. The method can still further include encapsulating, in a molding compound, the backside surface, the plurality of side surfaces, and a second portion of the active surface of the semiconductor die. The second portion of the active surface can be between the conductive bumps and a perimeter edge of the active surface. The molding compound can also be disposed between the plurality of semiconductor die. The method can also include forming a signal distribution structure. The signal distribution structure can be disposed on the conductive bumps, the insulating layer and the molding compound. The signal distribution structure can be configured to provide respective electrical connections to the plurality of conductive bumps.

BRIEF DESCRIPTION OF THE DRAWINGS

FIG. 1A is a diagram illustrating a plan view of a fan-out wafer level package (FOWLP).

FIG. 1B is a diagram illustrating a cross-sectional view of the FOWLP of FIG. 1A.

Figure 2A:
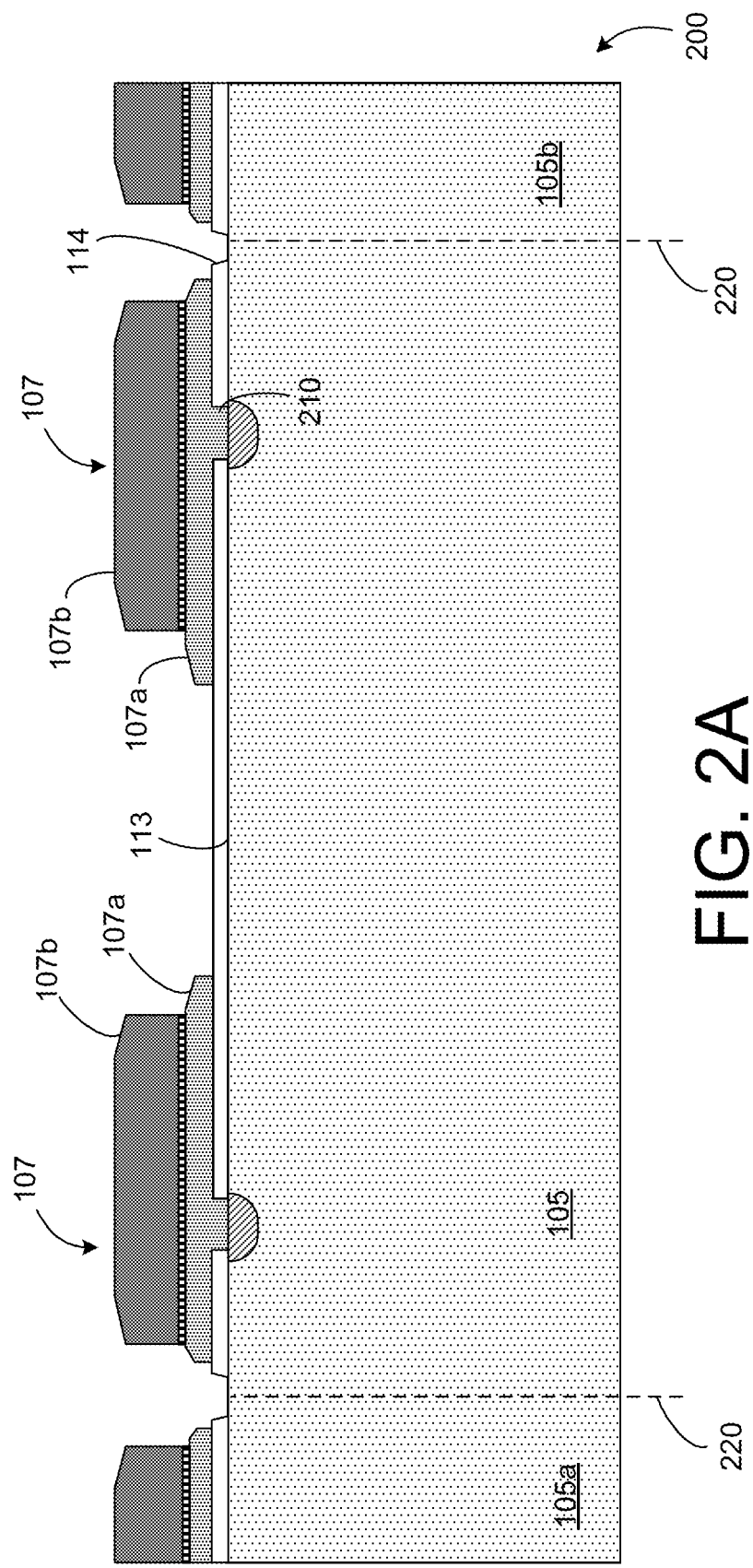
FIGS. 2A through 2N are diagrams illustrating a process for producing a FOWLP, such as the FOWLP of FIGS. 1A and 1B.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

This disclosure relates to packaged semiconductor device apparatus and associated methods of manufacturing packaged semiconductor devices. More specifically, this disclosure relates to fan-out wafer level packages (FOWLPs) for packaging semiconductor devices (semiconductor die), and associated manufacturing processes. The FOWLPs and manufacturing approaches disclosed herein can have reduced manufacturing cost and improved reliability over current FOWLP implementations.

For instance, using the approaches described herein, FOWLPs including semiconductor die that are encapsulated, at least partially, on all sides (e.g., six-sided encapsulation) can be produced using a single molding operation, as compared to current approaches, which can include multiple molding operations and/or molding compound grinding operations. For example, in some implementations, such as those described herein, FOWLPs can include semiconductor die that are fully encapsulated in molding compound on five sides (e.g., a back side surface and four side surfaces), and partially encapsulated on a front side surface (e.g., an active surface) using a single molding operation, which can reduce manufacturing costs.

In such approaches, semiconductor die included in a FOWLP can be mold-locked, as a result of such six-sided encapsulation. Such mold locking can improve structural stability of a resulting FOWLP, as compared to FOWLPs produced using current approaches. This improved structural stability can prevent stresses at edges of the semiconductor die that can cause damage, such as cracking of the semiconductor die. Such stresses, in current FOWLPs, can occur as a result of inadequate material coverage (e.g., voids due to insufficient step coverage) and/or mismatches in thermal characteristics (e.g., expansion and contraction) of materials included in a FOWLP, such as semiconductor materials, molding compound materials, dielectric (insulating) materials, and/or conductive materials (e.g., metal layers).

FIGS. 1A and 1B are diagrams illustrating a FOWLP 100. FIG. 1A is a diagram illustrating a plan (top side) view of the FOWLP 100. FIG. 1B is a diagram illustrating a cross-sectional view of the FOWLP 100 of FIG. 1A along the section line 1B-1B shown in FIG. 1A. Accordingly, the following discussion of the FOWLP 100 is made with respect to both FIGS. 1A and 1B. In FIG. 1A, the plan view of the FOWLP 100 is illustrated such that internal elements of the FOWLP 100 are shown, so as to illustrate relationships of the various elements of the FOWLP 100 to one another. In some implementations, these internal elements may, or may not be visible in such a plan view. That is, the FOWLP 100 is, in FIG. 1A, shown as a partial x-ray, or ghost view, to illustrate arrangement of the various elements of the FOWLP 100. Further, in FIG. 1B, the FOWLP 100 is illustrated prior to being separated (e.g., singulated) from a plurality of FOWLPs (including other semiconductor die), such as can be concurrently formed from a plurality of semiconductor die that are produced on a semiconductor wafer.

As shown in FIGS. 1A and 1B, the FOWLP 100 can include a semiconductor die 105, an insulating layer 115, a molding compound 125, and a signal distribution (e.g., fan-out) structure 135. In FIG. 1A, perimeter edges (e.g. four perimeter edges) of the semiconductor die are indicated with the reference number 105. As shown in FIGS. 1A and 1B, the semiconductor die 105 can include conductive bumps 107, edge surfaces 109, a backside surface 111, and an active surface 113. In some implementations, the conductive bumps 107 can be disposed on the active surface 113 of the semiconductor die 105, and can provide electrical connections to a circuit and/or electrical device (e.g., a power semiconductor device) that is implemented (as an integrated circuit) on the active surface 113 of the semiconductor die 105. The conductive bumps 107 can include metal, solder, solder flux, and/or any suitable electrically conductive material or combination of materials.

As shown in FIGS. 1A and 1B, the edge surfaces 109 and the backside surface 111 of the semiconductor die 105 can be fully encapsulated in the molding compound 125. As also shown in in FIGS. 1A and 1B, the molding compound 125 can wrap around, e.g., from the side surfaces 109 onto a portion of the active surface 113 of the semiconductor die 105, partially encapsulating the active surface 113 and locking (securing, mold locking, etc.) the semiconductor die 105 in the molding compound 125. As noted above, such mold locking can prevent reliability issues in the FOWLP 100, such as cracking of the semiconductor die 105. In the FOWLP 100 of FIGS. 1A and 1B, the molding compound 125 can also be disposed under (e.g., extend under, etc.) the signal distribution structure 135.

As illustrated in FIGS. 1A and 1B, the insulating (e.g., dielectric) layer 115, which can be a polyimide layer, a glass layer, or any other appropriate insulating material can be disposed on the active surface 113 and between the conductive bumps 107 of the semiconductor die 105. In the FOWLP 100, the portion of the active surface 113 of the semiconductor die 105 between the conductive bumps and the outer edges of the semiconductor die 105 can be devoid of the insulating layer 115. Accordingly, during a molding operation for the FOWLP 100, the molding compound can encapsulate the portion of the active surface 113 that is devoid of the insulating layer 115, while the insulating layer 115 can prevent (block, etc.) the molding compound 125 from flowing between the conductive bumps 107 during the molding process.

In the FOWLP 100 of FIGS. 1A and 1B, the signal distribution structure 135 can include a first dielectric layer 137a (which can be referred to an inter-layer dielectric layer), a second dielectric layer 137b, electrical connections 139 and conductive bumps 143. The first dielectric layer 137a and the second dielectric layer 137b (which can also be referred to as insulating layers 137a and 137b) can include glass, polyimide, oxide, and/or any other appropriate dielectric materials or combination of dielectric materials.

The first dielectric layer 137a can have via openings 141 formed therein, where a respective via opening 141 can be formed over each of the conductive bumps 107 of the semiconductor die 105. The first dielectric layer 137a can be disposed on the conductive bumps 107, disposed on the insulating layer 115, and on the molding compound 125. The first dielectric layer 137a can have a planar (upper) surface, which can be planarized using an appropriate process for the particular dielectric material used. The electrical connections 139 of the signal distribution structure 135 can be disposed on the planar surface of the first dielectric layer 137a and disposed in (and extend through) respective via openings 141 to electrically couple the electrical connections 139 with the conductive bumps 107. In some implementations, the electrical connections 139 can be formed by patterning a deposited conductive (metal) layer, e.g., using photolithography techniques.

In the FOWLP 100, the second dielectric layer 137b can be disposed on the first dielectric layer 137a and the electrical connections 139. As with the first dielectric layer 137a, the second dielectric layer 137a can have a planar (upper) surface. The second dielectric layer 137b can have via openings 145 defined therein, where the conductive bumps 143 can each be disposed in a respective via opening 145, providing electrical connections from the conductive bumps 143 to the conductive bumps 107 of the semiconductor die 105 (e.g., through the electrical connections 139).

As noted above, in FIG. 1B, the FOWLP 100 is illustrated prior to being separated (e.g., singulated) from a plurality of FOWLPs, such as can be concurrently formed from a plurality of semiconductor die, including semiconductor die 105a and 105b, in addition to the semiconductor die 105. In FIG. 1B, only portions (part) of the semiconductor die and FOWLPs on either side of the FOWLP 100 are illustrated. In some implementations, the semiconductor die 105, 105a and 105b can be produced on a semiconductor wafer and can implement a same, or a different circuit or device, depending on the particular implementation. As shown in FIG. 1B, saw streets can be defined by spaces 150 between signal distribution structures 135 of the FOWLP. The molding compound 125 can be cut (e.g., using a saw, a laser, plasma, etc.) to separate (singulate) the FOWLP 100 from other concurrently produced FOWLPs, such as respective FOWLPs including the semiconductor die 105a and 150b.

Figure 2B:
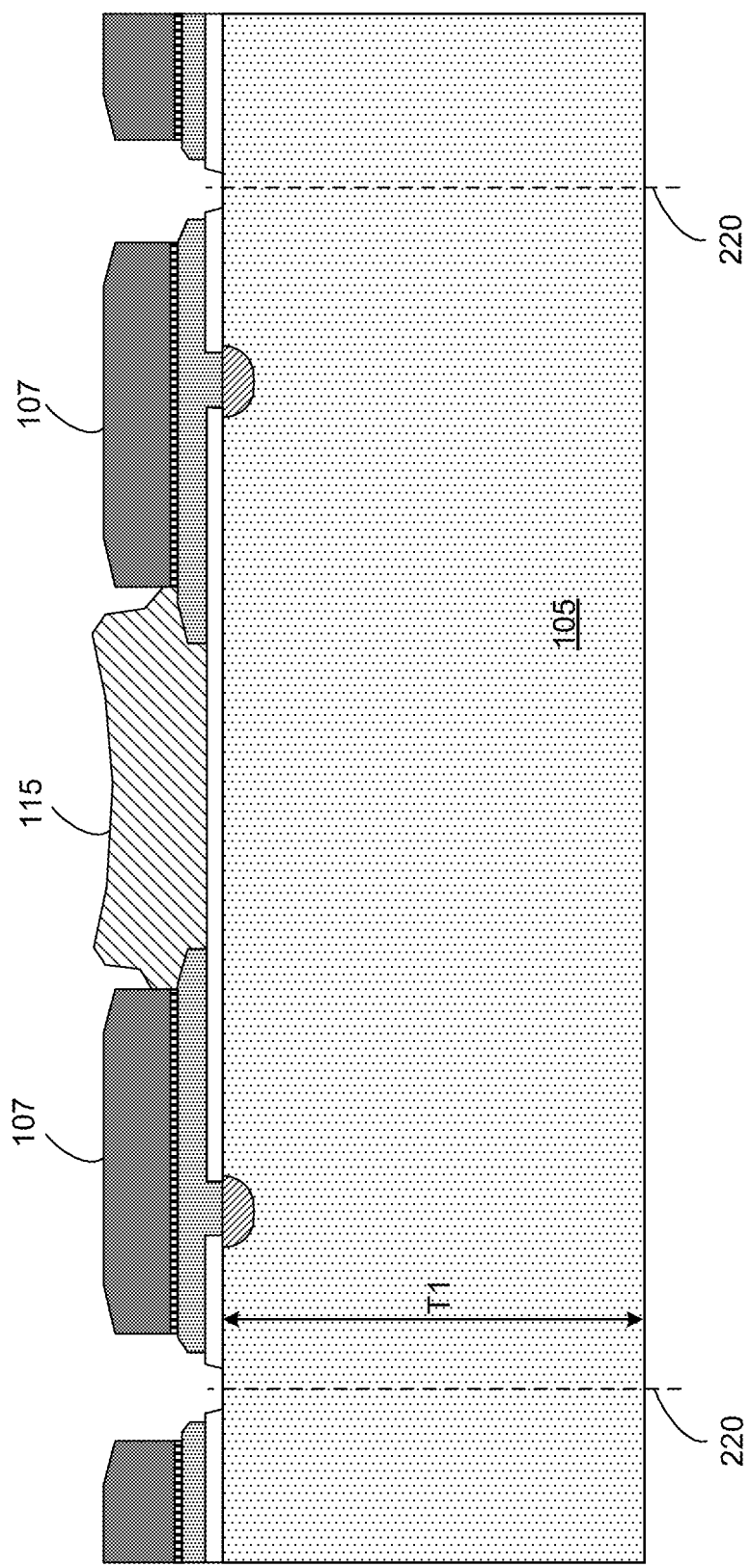
Figure 2C:
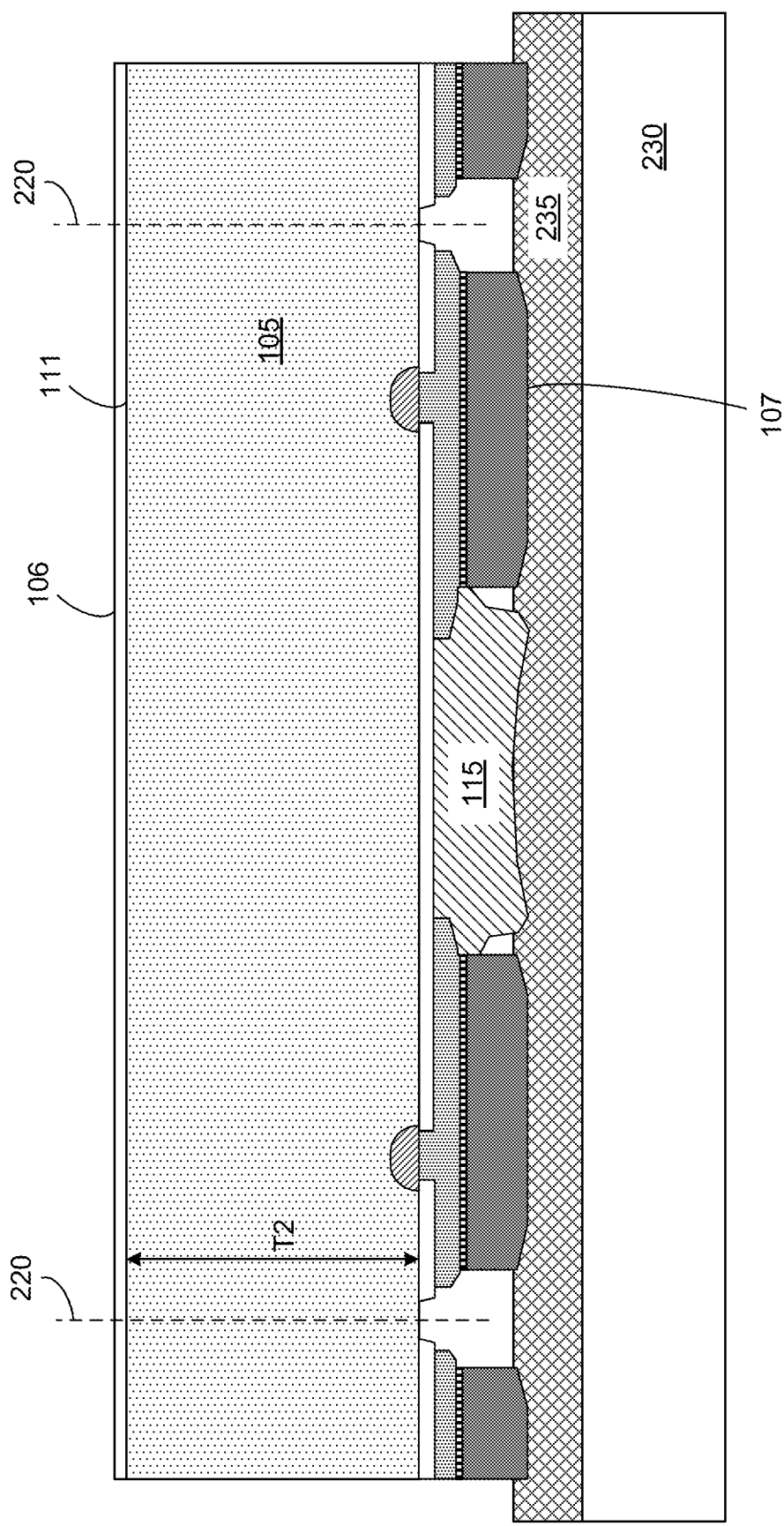
Figure 2D:
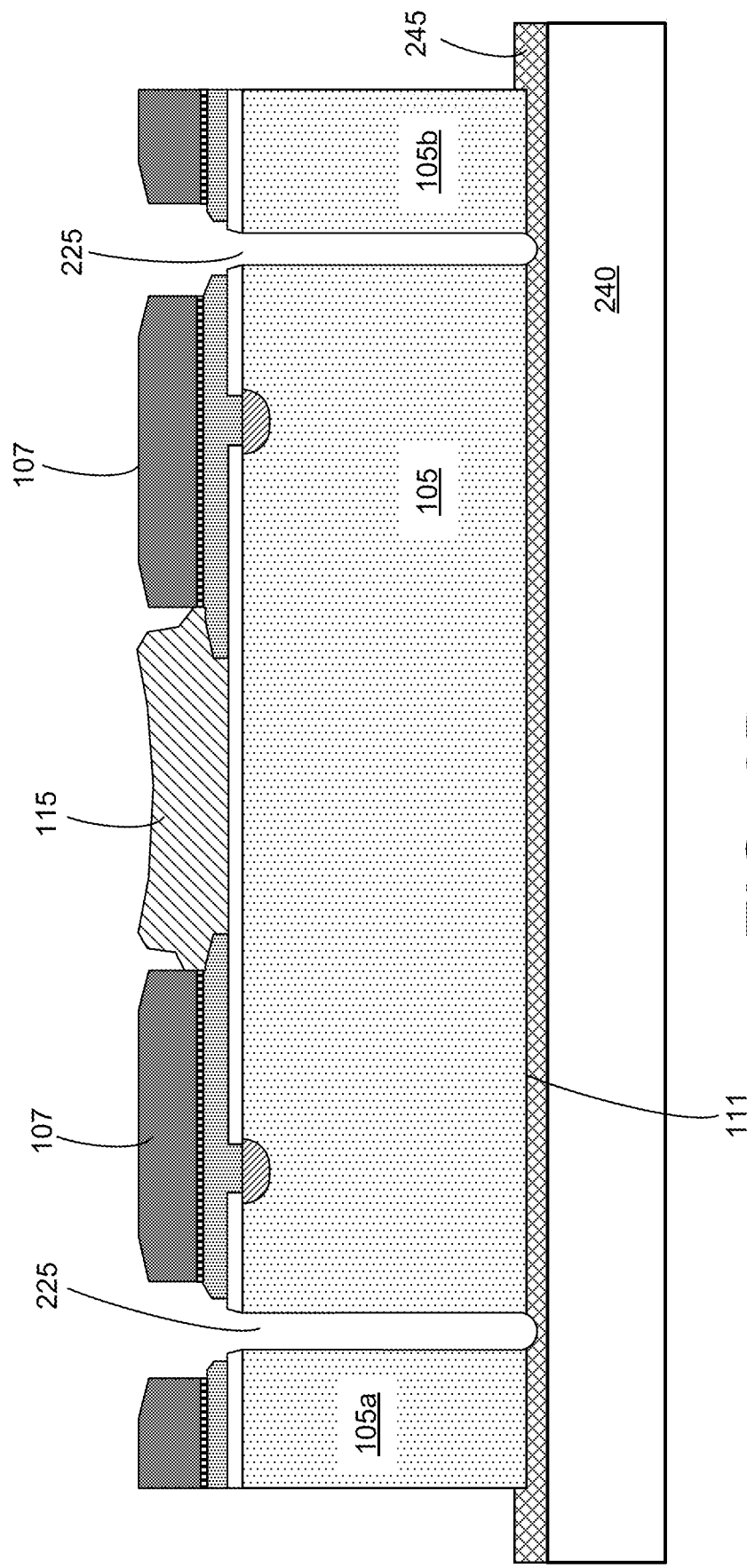
Figure 2E:
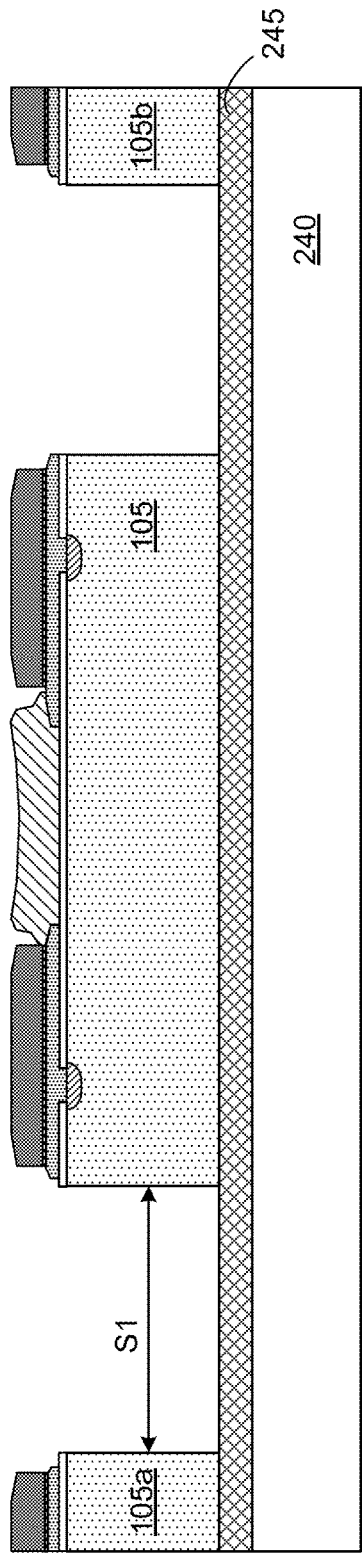
Figure 2F:
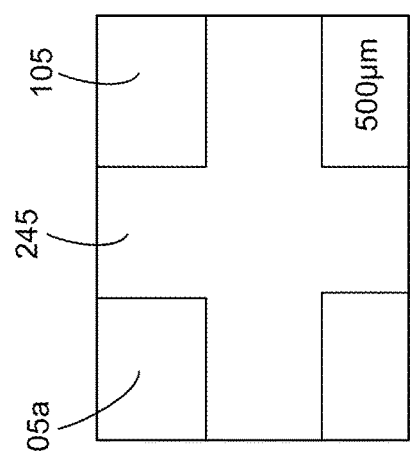
Figure 2G:
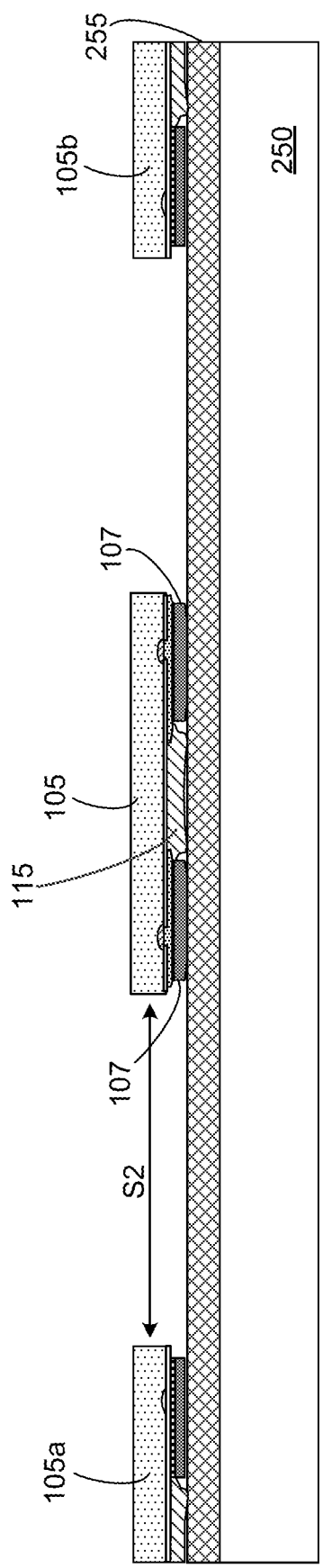
Figure 2H:
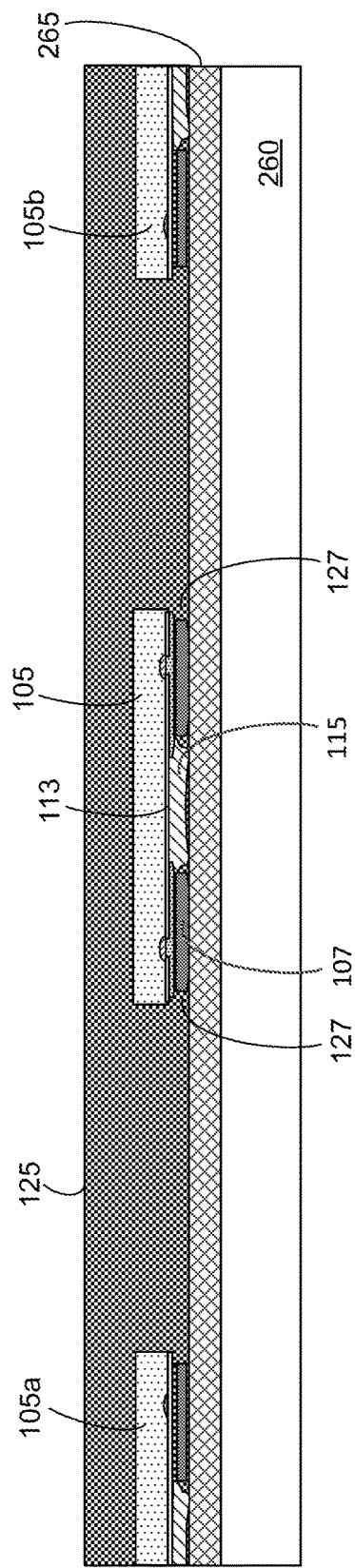
Figure 2I:
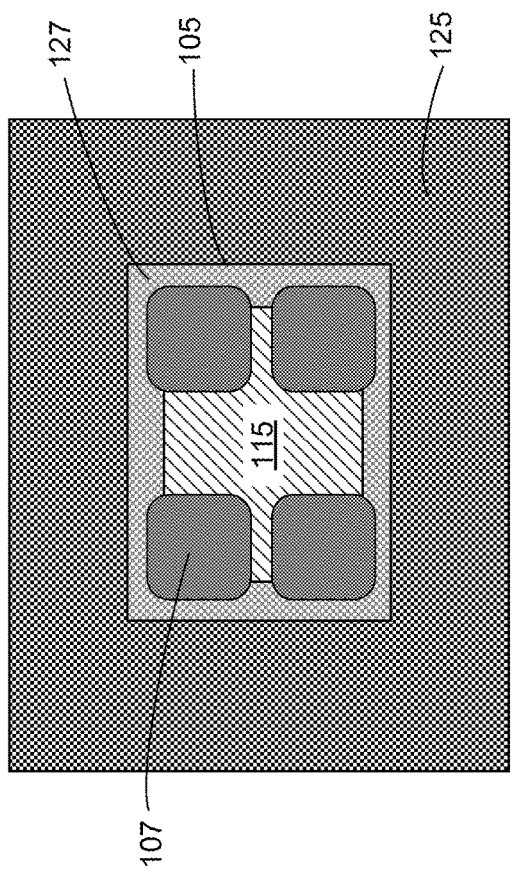
Figure 2J:
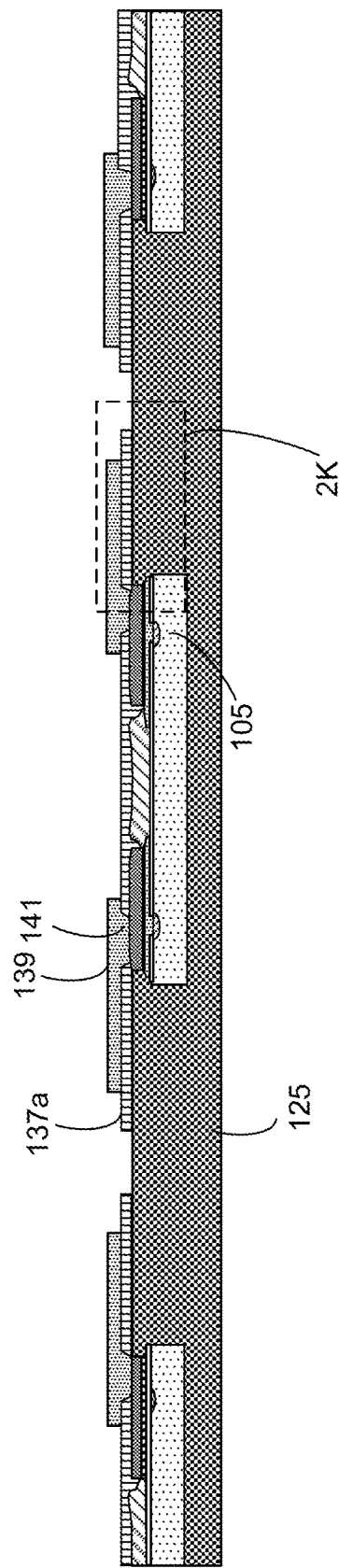
Figure 2K:
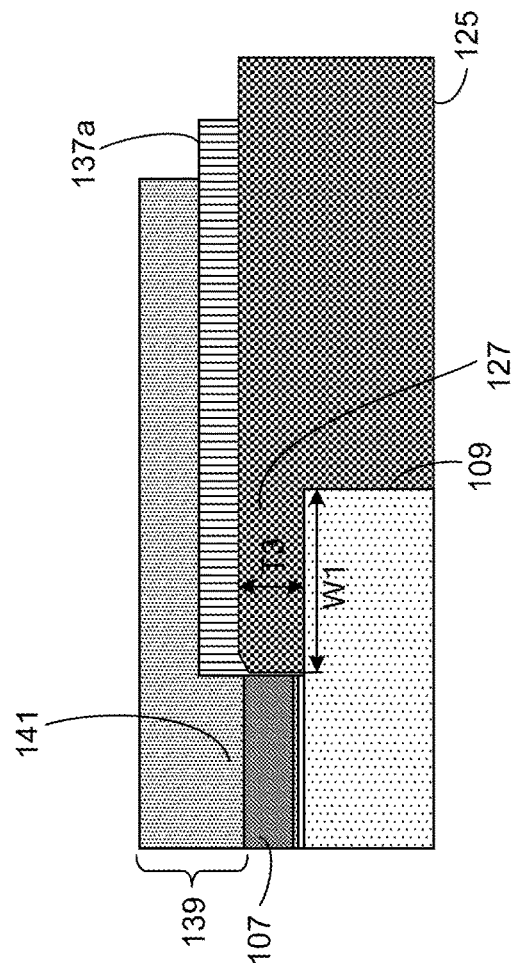
Figure 2L:
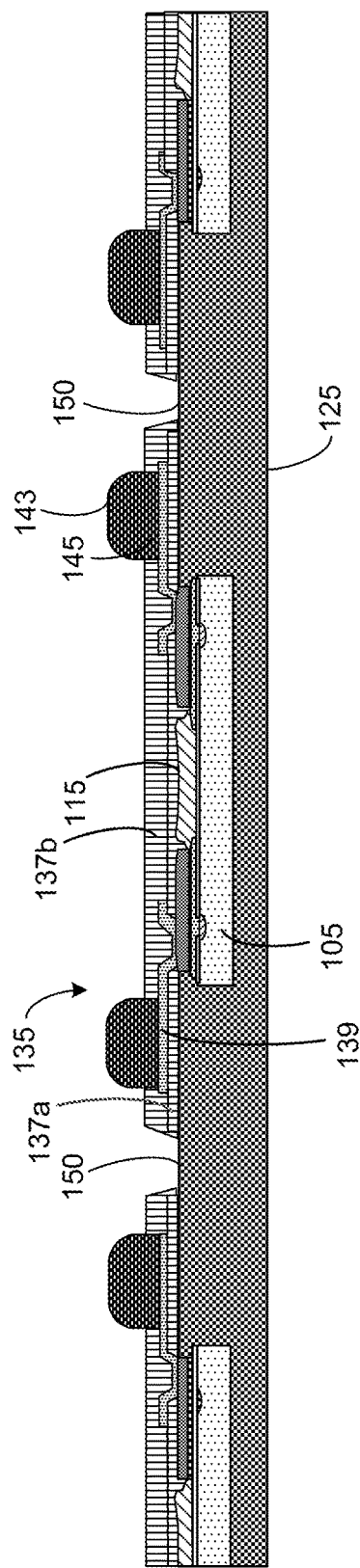
Figure 2M:
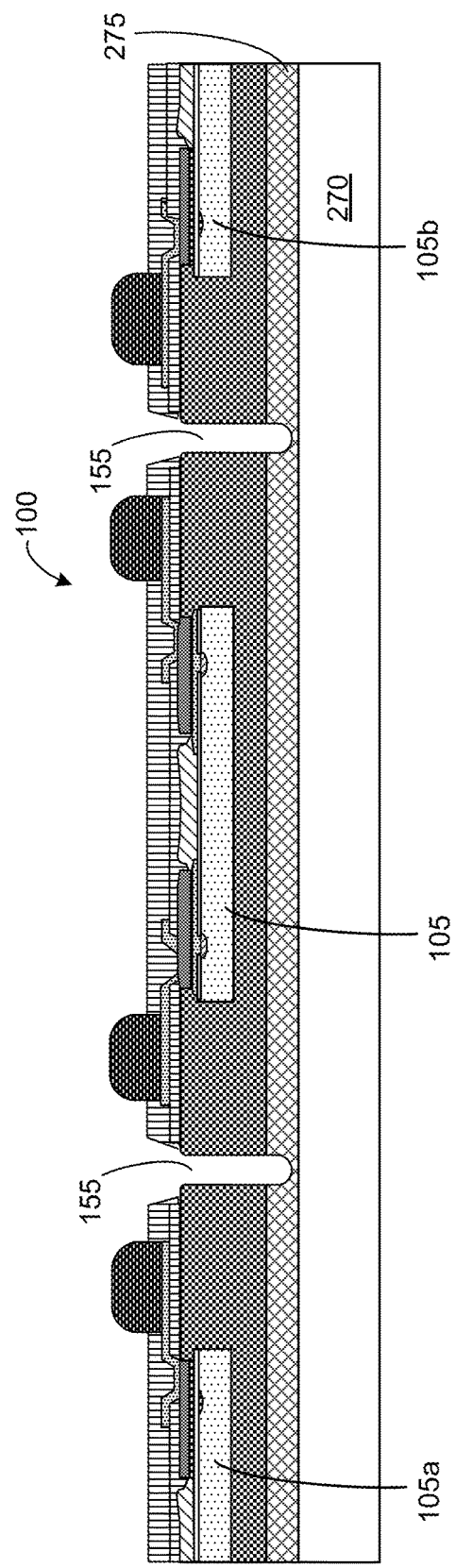
Figure 2N:
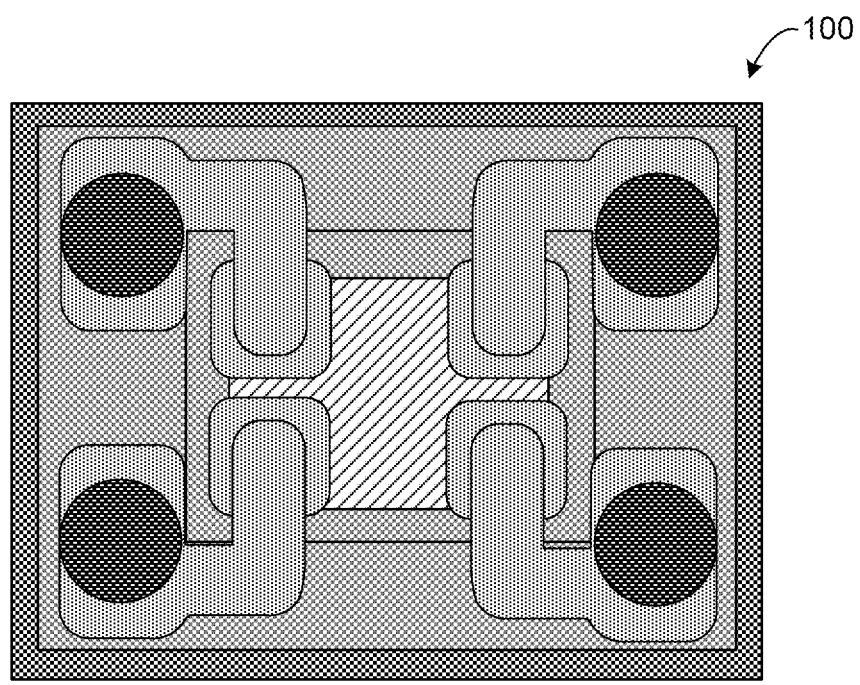

FIGS. 2A through 2N are diagrams illustrating a process for producing a FOWLP, such as the FOWLP 100 of FIGS. 1A and 1B. In some implementations, the process of FIGS. 2A-2N can be implemented to produce FOWLPs other than the FOWLP 100. For instance, the process of FIGS. 2A-2N (or a similar process) can be use to produce a FOWLP including multiple semiconductor die. In such a multiple semiconductor die FOWLP, an associated signal distribution layer can, in addition to providing external electrical connections (e.g., via conductive bumps 143), include electrical connections between the multiple semiconductor die included in such a FOWLP. In some implementations, other manufacturing processes can be used to produce a FOWLP, such as the FOWLPs described herein. However, for purposes of this disclosure and illustration, the process of FIGS. 2A-2N will be described with reference to the FOWLP 100 of FIGS. 1A and 1B.

Referring to FIG. 2A, a portion of a semiconductor substrate 200 that includes the semiconductor die 105 (as well as portions of adjacent semiconductor die 105a and 105b) is illustrated. As shown in FIG. 2A, the electrically conductive bumps 107 can be disposed (formed, produced, etc.) on the active surface 113 of the semiconductor die 105. For instance, the conductive bumps 107 can be disposed on a passivation (e.g., glass, dielectric, etc.) layer 114. The conductive bumps 107 can be electrically connected with a circuit and/or semiconductor device that is defined on the active surface 113 of the semiconductor die 105 using electrical (e.g., Ohmic) contacts 210 that extend through the passivation layer 114 (e.g., through contact openings). For purposes of clarity, such circuitry and/or semiconductor devices on the active surface 113 of the semiconductor die 105 is/are not shown in FIGS. 2A-2N.

In some implementations, the conductive bumps 107 can include an underlying (first) conductive material 107a, and a second conductive material 107b that is disposed on the underlying conductive material 107a. The second conductive material 107b can be formed using evaporation, electrolytic plating, electroless plating, ball drop, and/or screen printing processes. In some implementations, the second conductive material 107b can be aluminum (Al), tin (Sn), nickel (Ni), gold (Au), silver (Ag), lead (Pb), bismuth (Bi), copper (Cu), solder, and/or combinations thereof, and can further include a solder flux. In some implementations, the second conductive material 107b can be eutectic Sn/Pb, high-lead solder, or lead-free solder.

In some implementations, the second conductive material 107b can be bonded to the underlying conductive material 107a using an attachment or bonding process. For instance, the second conductive material 107b can be reflowed by heating the second conductive material 107b above its melting point to form balls or bumps. In some implementations, the second conductive material 107b can be reflowed a second time, which can improve electrical contact (e.g., reduce resistance) to the underlying conductive material 107a. Conductive bumps 107, as described herein, are disclosed, by way of example, as one possible electrical interconnect that can be configured to provide electrical connections to circuitry formed on the active surface 113 of the semiconductor die 105. In some implementations, other approaches for providing such electrical connections can be used, such as conductive paste, stud bumps, micro bumps, conductive pillars, or other electrical connections.

As further shown in FIG. 2A, openings between the passivation layers 114 of the semiconductor die 105, 105a and 105b can define scribe (saw) streets 220 (indicated by dashed lines) between the semiconductor die. As described in further detail below with respect to FIG. 2D, the semiconductor die 105, 105a and 105b can be singulated (separated along the scribe streets 220) as part of the FOWLP manufacturing process of FIGS. 2A-2N.

As shown in FIG. 2B, the insulating layer 115 can be formed on the active surface 113 of the semiconductor die 105 between the conductive bumps 107. The insulating layer 115 can be formed using vapor deposition, printing, lamination, spin coating, spray coating, sintering, and/or other processes. The insulating layer 115 can include one or more layers of insulating material, such as silicon dioxide ($SiO_2$), silicon nitride ($Si_3N_4$), silicon oxynitride (SiON), tantalum pentoxide ($Ta_2O_5$), aluminum oxide ($Al_2O_3$), hafnium oxide ($HfO_2$), benzocyclobutene (BCB), polyimide (PI), polybenzoxazoles (PBO), mold compound, polymer, and/or other dielectric material having appropriate structural and insulating properties.

As shown in FIG. 2B (as well as in FIG. 1A), the insulating layer 115 can substantially fill spaces between conductive bumps 107 on the active surface 113, though some gaps between the conductive bumps 107 and the insulating layer 115 may be present. Further, as is shown in FIG. 2B (and FIG. 1A), in this example implementation, the insulating layer 115 can be formed between the conductive bumps 107, where the insulating layer 115 contacts, at most, two sides of each conductive bump 107. In other words, in this example implementation, the area of the active surface 113 between the conductive bumps 107 and the side surfaces 109 of the semiconductor die 105 can be devoid of the insulating layer 115. Depending on the particular implementation, the insulating layer 115 can be formed as part of a wafer manufacturing process, or as part of a FOWLP manufacturing process. In some implementations, the insulating layer 115 can be formed prior to forming conductive bumps 107, and via openings can be formed in the insulating layer 115. In this example, the conductive bumps 107 can electrically contact the active surface 113 of the semiconductor die 105 through the openings that are formed in the insulating layer 115. As also shown in FIG. 2B, the semiconductor substrate 200 (and the semiconductor die 105) can have a thickness (e.g., an initial or starting thickness) of T1.

Referring to FIG. 2C, the semiconductor substrate 200, including the semiconductor die 105, can be inverted from the orientation shown in FIG. 2B and mounted on a back-grinding tape (e.g., a stiff polyester tape) 230 using an adhesive layer 235. As shown in FIG. 2C, the adhesive layer 235 can be in contact with (disposed on) the conductive bumps 107 and the insulating layer 115, which can secure the semiconductor substrate 200 to the back-grinding tape. A portion of the semiconductor substrate 200 (and the semiconductor die 105) can be removed from the back side surface 111 using a grinding process. As shown in FIG. 2C, the grinding process can reduce a thickness of the substrate 200 from the thickness T1 of FIG. 2B, to a thickness T2, where T2<T1. As further shown in FIG. 2, in some implementations, a back side metal layer 106 can be formed (e.g., using vapor deposition, sputtering, etc.) on the back side surface 111 of the semiconductor die 105 (e.g., the substrate 200). While not specifically shown in FIGS. 2D-2N, in some implementations, such a back side metal layer 106 can be included on the semiconductor die 105 of the example FOWLP 100.

The process can then continue to FIG. 2D, where the semiconductor substrate 200, while still coupled with the back-grinding tape 230 via the adhesive layer 235, can be inverted and the back side surface 111 of the substrate 200 can be coupled to an expandable dicing tape 240 and an adhesive layer 245. The back-grinding tape 230 and the adhesive layer 235 can then be removed from the substrate 200.

As shown in FIG. 2D, after the back-grinding tape 230 and the adhesive layer 235 have been removed, the semiconductor die 105 can be singulated, e.g., from at least the semiconductor die 105a and 105b, by creating cut openings 225 through the semiconductor substrate 200 along the scribe streets 220. In some implementations, the cut openings 225 can be formed using plasma etching, which can have certain advantages, such as forming precision side surfaces 109 along the saw streets 220 and, allowing for forming cut openings 225 of different widths on a same semiconductor wafer. In some implementations, the semiconductor die 105 can be singulated from the semiconductor substrate 200 using a saw blade or laser cutting tool. Semiconductor die 105, 105a and 105b can remain affixed to dicing tape 240, and the FOWLP manufacturing process can move to the operations illustrated by FIGS. 2E and 2F. In some implementations, the singulated semiconductor die can be picked, inverted, and placed onto a separate carrier or tape, with spacings such as those shown in FIG. 2G.

As shown in FIGS. 2E and 2F, the dicing tape 240 (and the adhesive layer 245) between the die can be expanded in the x-direction and the y-direction (as shown by the axes in FIG. 2F) to increase spacing (from a width of the cut openings 225 to the spacing S1) between the semiconductor die 105 and adjacent semiconductor die (e.g., the semiconductor die 105a and 105b). In some implementations, the dicing tape 240 and the associated adhesive layer 245 between the die can be differentially expanded in the x-direction and the y-direction using an expansion table that moves independently in the x-direction and the y-direction and stretches the dicing tape 240 (and the adhesive layer 245). In some implementations, the semiconductor die can have different spacings in the x-direction than in the y-direction.

In some implementations, because the dicing tape 240 may not uniformly expand in both the x-direction and the y-direction, widths of the cut opening 225 for the saw streets 220 can differ between those that are aligned in the x-direction and those that are aligned it the y-direction, which can compensate for different amounts of expansion of the dicing tape 240 in the x-direction and the y-direction.

The process can then continue to FIG. 2G, where the singulated semiconductor die 105, 105a and 105b, while still coupled with the stretched dicing tape 240 via the adhesive layer 245, can be inverted and coupled to another expandable (a second expandable) carrier or tape 250 (e.g., a polymer material) using an expandable adhesive layer 255. The dicing tape 240 and the adhesive layer 245 can then be removed from the singulated semiconductor die.

As shown in FIG. 2G, the expandable carrier or tape 250 (and the adhesive layer 255) can be expanded (e.g., in both the x-direction and the y-direction) to further increase spacing between the semiconductor die 105 and adjacent semiconductor die (e.g., the semiconductor die 105a and 105b), such as from the spacing S1 of FIG. 2E to the spacing S2 of FIG. 2G, where S2>S1. In some implementations, the carrier or tape 250 and the associated adhesive layer 255 can be differentially expanded in the x-direction and the y-direction using an expansion table that moves independently in the x-direction and the y-direction and stretches the carrier or tape 250 (e.g., to appropriately space the singulated semiconductor die for further processing to produce FOWLPs, such as the FOWLP 100). In some implementations, the singulated semiconductor die can be picked and placed on a carrier or tape, such as the carrier or tape as described below with respect to FIG. 2H, with spacings such as those shown in FIG. 2G. In other embodiments, two or more semiconductor die can be placed such that they will be contained together into a single FOWLP.

As shown in FIG. 2H, the singulated and spaced semiconductor die of FIG. 2G can be transferred (e.g., using one or more carrier to carrier or tape to tape transfers, such as those described above) to a carrier or tape 260 using an (adhesive) interface layer 265. The carrier 260 can be formed from an overmold tape, a polymer, beryllium oxide, silicon, glass, or other suitable material for structural support. The interface layer 265 can be formed over (disposed on, etc.) a surface of the carrier 260 as a temporary adhesive bonding film, etch-stop layer, and/or thermal release layer. The carrier 260 and the associated interface layer 265 can then be disposed on the conductive bumps 107 and the insulating layer 115 for structural support, where spaces 127 can remain between the interface layer 265 and the active surface 113 of the semiconductor die 105 (e.g., to allow for mold locking the semiconductor die 105 in the molding compound 125).

As also shown in FIG. 2H, after coupling the singulated and spaced semiconductor die (e.g., with spacings S2) to the carrier 260 with the interface layer 265, the molding compound (encapsulant) 125 can be disposed (e.g., deposited, flowed, etc.) over and between the semiconductor die 105, 105a and 105b, as well as into the space(s) 127, to achieve a six-sided (mold locked) encapsulation of the semiconductor die 105 (e.g. after curing of the molding compound 125). Depending on the particular implementation, the molding compound 125 can be formed (applied, etc.) using paste printing, compression molding, transfer molding, liquid encapsulant molding, vacuum lamination, film-assisted molding, spin coating, and/or any other suitable application process. The molding compound 125 can be a polymer, a polymer composite material, such as an epoxy resin with filler, an epoxy acrylate with filler, or a polymer with filler. The molding compound 125 can (should) be non-conductive, and provide physical support, and environmentally protect the semiconductor die 105 from external elements and contaminants.

FIG. 2I illustrates a portion of the molded structure of FIG. 2H including the semiconductor die 105, e.g., from the bottom side of the molded structure, as shown in FIG. 2H, after removal of the carrier 260 and the interface layer 265. FIG. 2I illustrates, in a plan view, an arrangement of the semiconductor die 105, the conductive bumps 107 of the semiconductor die 105, the insulating layer 115, the molding compound 125 and the location of the space 127, which is disposed around the conductive bumps 107 on a perimeter of the semiconductor die 105. As shown in FIG. 2I, a portion of the molding compound 125 is disposed in the space 127, but does not extend into area of the insulation layer 115.

FIGS. 2J-2L illustrate formation of the signal distribution structure 135 of the FOWLP 100. As shown in FIG. 2J, after removal of the carrier 260 and the interface layer 265, the dielectric layer 137a can be formed on the conductive bumps 107, the insulating layer 115 and the molding compound 125. The insulating layer 137a, can be planarized using an appropriate process, such as a reflow process, a polishing process, etc. Via openings 141 can be formed in, and extend through the dielectric layer 137a to the conductive bumps 107. The electrical connections 139 can then be formed (e.g., by patterning a metal layer that is disposed, or formed on the dielectric layer 137a and disposed in the via opening 141). As noted above, the electrical connections 139 can be electrically coupled with respective conductive bumps 107 of the semiconductor die 105.

FIG. 2K illustrates a portion of the cross-sectional view of FIG. 2J that is indicated by the inset 2K. As shown in FIG. 2K, the electrical connection(s) 139 can be disposed on the planar upper surface of the dielectric layer 137a, and also be disposed in (e.g., fill) the via opening(s) 141 to create electrical contact(s) with the conductive bump(s) 107. As also shown in FIG. 2K, the molding compound 125 can fill the space 127 between the semiconductor die 105 and the dielectric layer 137a. As indicated in FIG. 2K, the molding compound can have a thickness of T3 between the semiconductor die 105 and the dielectric layer 137a, and a width W1 between the conductive bump and edge (edge surface 109) of the semiconductor die. In some implementations, T3 can be greater than or equal to 5 micrometers (μm), and W1 can also be greater than or equal to 5 μm.

As shown in FIG. 2L, after the operations illustrated in FIG. 2J, the dielectric layer 137b of the signal distribution structure 135 can be formed on the conductive layer 137a and the electrical connections 139. As with the insulating layer 137a, the insulating layer 137b can be planarized using an appropriate process, such as a reflow process, a polishing process, etc. Via openings 145 can be formed in, and extend through the dielectric layer 137b to the electrical connections 139. The conductive bumps 143 of the signal distribution structure 135 can then be disposed (formed, etc.) in the via openings 143 (e.g., on respective electrical connections 139). FIG. 2L corresponds with FIG. 1B.

As shown in FIG. 2M, after completion of the signal distribution structure 135, the structure (assembly) shown in FIG. 2L can be coupled with a dicing tape 270 (e.g., a polymer base material) using an adhesive layer 275. Channels 155 can be formed along the saw streets 150 shown in, for example, FIG. 2L. As shown in FIG. 2M the channels 155 can be formed completely through the molding compound 125 and into the adhesive layer 275 to singulate the FOWLP 100, as shown in FIG. 2N, from other concurrently formed FOWLPs. For instance, the channel 155 can be formed around each semiconductor die 105, 105a and 105b using, e.g., a saw blade or laser cutting tool. In some embodiments, more than one semiconductor die 105 or different sizes and types of semiconductor die can be combined into each singulated FOWLP 100. FIG. 2N corresponds with FIG. 1A. Accordingly, for the purpose of brevity, the details of the FOWLP 100 discussed with respect to FIGS. 1A and 1B, are not repeated again here.

Figure 3:
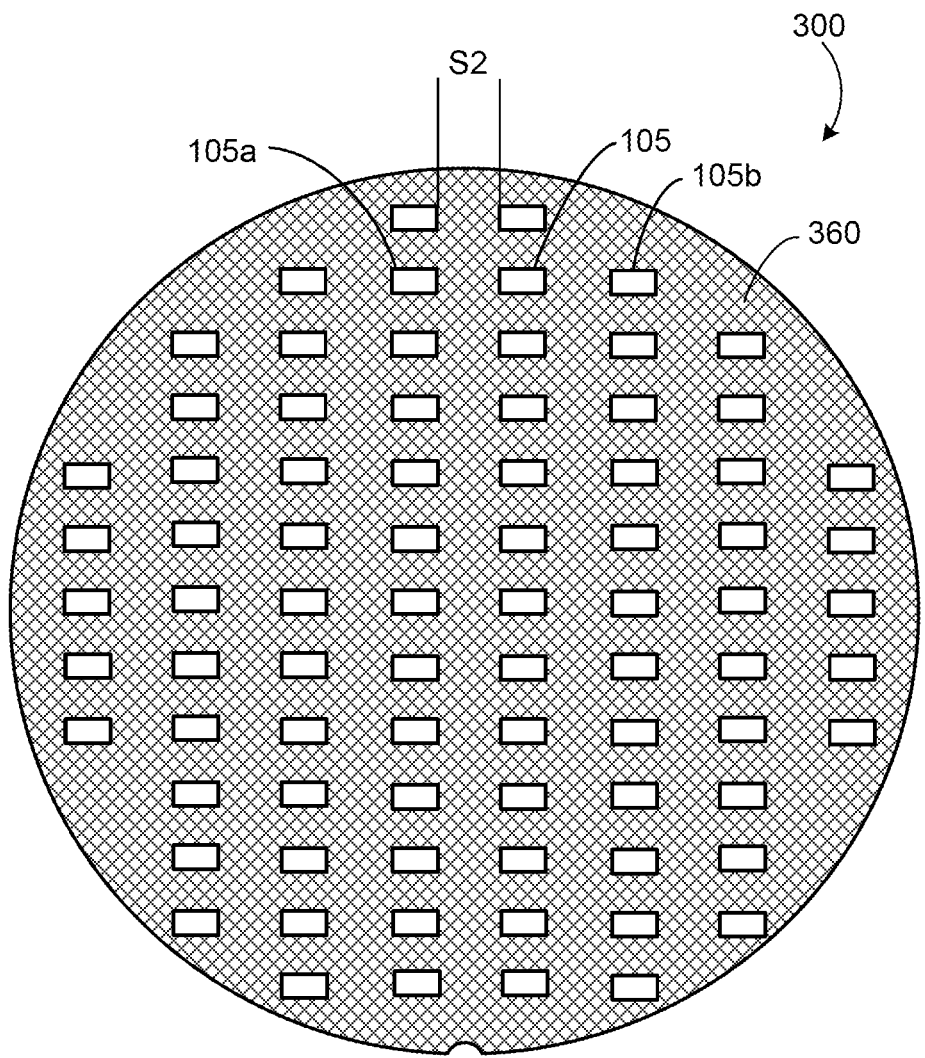
FIG. 3 is a schematic diagram illustrating semiconductor die for fan-out wafer level packaging disposed on a carrier.

FIG. 3 is a schematic diagram illustrating semiconductor die 105, 105a and 105b disposed on a carrier 360 for fan-out wafer level packaging. The carrier 360 can, for example, be the carrier 260 of FIG. 2H (e.g., after the two carrier stretching processes of FIGS. 2E and 2G, and transfer of the semiconductor die 105, 105a and 105b to the carrier 260). Accordingly, the spacing of the semiconductor die 105 in FIG. 3 could be, with reference to FIG. 2G, the spacing S2, as is indicated in FIG. 3. In some implementations, other spacings, such as larger or smaller spacings can be used, where the particular spacing between semiconductor die can depend on the particular FOWLP being produced. Using the process of FIGS. 2A-2N, FOWLPs including the semiconductor die 105 shown in FIG. 3 can be concurrently produced, where each FOWLP can include one or more of the semiconductor die 105.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, Silicon (Si), Gallium Arsenide (GaAs), Gallium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A fan-out wafer level package (FOWLP) semiconductor device, comprising:
    a semiconductor die having:
        an active surface;
        a backside surface opposite the active surface;
        a plurality of side surfaces, each side surface of the plurality of side surfaces extending between the active surface and the backside surface; and
        a plurality of conductive bumps disposed on the active surface;
    an insulating layer disposed on a first portion of the active surface and excluded from a second portion of the active surface, the first portion of the active surface being disposed between the plurality of conductive bumps, the second portion of the active surface being disposed between the plurality of conductive bumps and a perimeter edge of the active surface, the insulating layer respectively contacting, at most, two sides of conductive bumps of the plurality of conductive bumps;
    a molding compound, the molding compound:
        encapsulating the backside surface, and the plurality of side surfaces; and
        partially encapsulating the active surface, such that the second portion of the active surface is encapsulated in the molding compound and the molding compound is excluded from the first portion of the active surface; and
    a signal distribution structure disposed on the plurality of conductive bumps, disposed on the insulating layer, and disposed on the molding compound, the signal distribution structure being configured to provide respective electrical connections to the plurality of conductive bumps.

2. The FOWLP semiconductor device of claim 1, wherein a thickness of the molding compound on the active surface is greater than or equal to five micrometers.

3. The FOWLP semiconductor device of claim 1, wherein a width of the molding compound on the active surface between the plurality of conductive bumps and the perimeter edge of the active surface is greater than or equal to five micrometers.

4. The FOWLP semiconductor device of claim 1, wherein the signal distribution structure includes:
    a dielectric layer disposed on the insulating layer, disposed on the plurality of conductive bumps, and disposed on the molding compound, the dielectric layer having a planar surface;
    a plurality of via openings through the dielectric layer; and
    a plurality of electrical connections to the plurality of conductive bumps, each of the plurality of electrical connections being disposed on the planar surface of the dielectric layer and disposed in a respective via opening of the plurality of via openings.

5. The FOWLP semiconductor device of claim 4, wherein the plurality of conductive bumps is a first plurality of conductive bumps and the dielectric layer is a first dielectric layer, the signal distribution structure further including:
    a second dielectric layer disposed on the plurality of electrical connections and the first dielectric layer;
    a plurality of via openings through the second dielectric layer; and
    a second plurality of conductive bumps disposed in respective via openings of the plurality of via openings of the second dielectric layer, and disposed on respective electrical connections of the plurality of electrical connections.

6. The FOWLP semiconductor device of claim 1, wherein the insulating layer includes a polyimide material.

7. The FOWLP semiconductor device of claim 1, wherein the second portion of the active surface, at least partially, surrounds the first portion of the active surface.

8. The FOWLP semiconductor device of claim 1, wherein the backside surface is a ground surface of the semiconductor die, the semiconductor die further including a metal layer disposed on the ground surface.

9. A fan-out wafer level package (FOWLP) semiconductor device, comprising:
    a semiconductor die having:
        an active surface;
        a backside surface opposite the active surface;
        a plurality of side surfaces, each side surface of the plurality of side surfaces extending between the active surface and the backside surface; and
        a plurality of conductive bumps disposed on the active surface;
    an insulating layer disposed on a first portion of the active surface and excluded from a second portion of the active surface, the first portion of the active surface being disposed between the plurality of conductive bumps, the second portion of the active surface being disposed between the plurality of conductive bumps and a perimeter edge of the active surface, the insulating layer respectively contacting, at most, two sides of conductive bumps of the plurality of conductive bumps;
    a molding compound, the molding compound:
        encapsulating the backside surface, and the plurality of side surfaces; and
        partially encapsulating the active surface, such that the second portion of the active surface is encapsulated in the molding compound and the molding compound is excluded from the first portion of the active surface, a thickness of the molding compound on the active surface being greater than or equal to five micrometers; and
    a signal distribution structure configured to provide respective electrical connections to the plurality of conductive bumps,
    the signal distribution structure including:
        a dielectric layer disposed on the insulating layer;
        a plurality of via openings through the dielectric layer; and
        a plurality of electrical connections to the plurality of conductive bumps to the plurality of via openings.

10. The FOWLP semiconductor device of claim 9, wherein the plurality of conductive bumps is a first plurality of conductive bumps and the dielectric layer is a first dielectric layer, the signal distribution structure further including:
    a second dielectric layer disposed on the plurality of electrical connections and the first dielectric layer;

a plurality of via openings through the second dielectric layer; and a second plurality of conductive bumps disposed in respective via openings of the plurality of via openings of the second dielectric layer, and disposed on respective electrical connections of the plurality of electrical connections.

11. The FOWLP semiconductor device of claim 9, wherein a width of the molding compound on the active surface between the plurality of conductive bumps and the perimeter edge of the active surface is greater than or equal to five micrometers.

12. The FOWLP semiconductor device of claim 9, wherein the insulating layer includes a polyimide material.

13. The FOWLP semiconductor device of claim 9, wherein the second portion of the active surface, at least partially, surrounds the first portion of the active surface.

14. The FOWLP semiconductor device of claim 9, wherein the backside surface is a ground surface of the semiconductor die, the semiconductor die further including a metal layer disposed on the ground surface.

15. A fan-out wafer level package (FOWLP) semiconductor device, comprising:
   a semiconductor die having:
      an active surface;
      a backside surface opposite the active surface;
      a plurality of side surfaces, each side surface of the plurality of side surfaces extending between the active surface and the backside surface; and
      a plurality of conductive bumps disposed on the active surface;
   an insulating layer disposed on a first portion of the active surface and excluded from a second portion of the active surface, the first portion of the active surface being disposed between the plurality of conductive bumps, the second portion of the active surface being disposed between the plurality of conductive bumps and a perimeter edge of the active surface, the insulating layer respectively contacting, at most, two sides of conductive bumps of the plurality of conductive bumps;
   a molding compound, the molding compound:
      encapsulating the backside surface, and the plurality of side surfaces; and
      partially encapsulating the active surface, such that a second portion of the active surface is encapsulated in the molding compound and the molding compound is excluded from the first portion of the active surface, a thickness of the molding compound on the active surface being greater than or equal to five micrometers, and a width of the molding compound on the active surface between the plurality of conductive bumps and the perimeter edge of the active surface being greater than or equal to five micrometers, the molding compound on the second portion of the active surface having a thickness that corresponds with the thickness of the insulating layer and the thickness of the plurality of conductive bumps; and a signal distribution structure configured to provide respective electrical connections to the plurality of conductive bumps.

16. The FOWLP semiconductor device of claim 15, wherein the signal distribution structure includes:
   a dielectric layer disposed on the insulating layer, disposed on the plurality of conductive bumps, and disposed on the molding compound, the dielectric layer having a planar surface;
   a plurality of via openings through the dielectric layer; and
   a plurality of electrical connections to the plurality of conductive bumps, each of the plurality of electrical connections being disposed on the planar surface of the dielectric layer and disposed in a respective via opening of the plurality of via openings.

17. The FOWLP semiconductor device of claim 16, wherein the plurality of conductive bumps is a first plurality of conductive bumps and the dielectric layer is a first dielectric layer, the signal distribution structure further including:
   a second dielectric layer disposed on the plurality of electrical connections and the first dielectric layer;
   a plurality of via openings through the second dielectric layer; and
   a second plurality of conductive bumps disposed in respective via openings of the plurality of via openings of the second dielectric layer, and disposed on respective electrical connections of the plurality of electrical connections.

18. The FOWLP semiconductor device of claim 15, wherein the insulating layer includes a polyimide material.

19. The FOWLP semiconductor device of claim 15, wherein the second portion of the active surface, at least partially, surrounds the first portion of the active surface.

20. The FOWLP semiconductor device of claim 15, wherein the backside surface is a ground surface of the semiconductor die, the semiconductor die further including a metal layer disposed on the ground surface.

* * * * *